(12) United States Patent  (10) Patent No.: US 8,878,065 B2
Lin  (45) Date of Patent: Nov. 4, 2014

(54) FLEXIBLE CIRCUIT CABLE WITH AT LEAST TWO BUNDLED WIRE GROUPS

(75) Inventor: Gwun Jin Lin, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 300 days.

(21) Appl. No.: 13/541,887

(22) Filed: Jul. 5, 2012

(65) Prior Publication Data

US 2013/0312999 A1  Nov. 28, 2013

(30) Foreign Application Priority Data

May 25, 2012 (TW) .............................. 101118695 A

(51) Int. Cl.
*H01B 7/00*  (2006.01)

(52) U.S. Cl.
USPC .................................... 174/117 R; 174/117 F

(58) Field of Classification Search
USPC ............. 174/36, 110 R, 113 R, 117 R, 117 F, 174/117 FF, 74 R, 78, 77 R
See application file for complete search history.

(56) References Cited

U.S. PATENT DOCUMENTS

| | | | | |
|---|---|---|---|---|
| 5,710,393 A * | 1/1998 | Smith et al. | ................ | 174/74 R |
| 8,502,080 B2 * | 8/2013 | Lin et al. | ................ | 174/254 |
| 2011/0031703 A1 * | 2/2011 | Hayashi | ................ | 277/626 |
| 2011/0094790 A1 | 4/2011 | Lin et al. | | |
| 2011/0140539 A1 * | 6/2011 | Yamamoto et al. | ........... | 307/104 |
| 2011/0266050 A1 | 11/2011 | Su et al. | | |
| 2012/0018196 A1 | 1/2012 | Lin et al. | | |
| 2012/0325527 A1 * | 12/2012 | Lin et al. | ................ | 174/254 |
| 2012/0325528 A1 * | 12/2012 | Lin et al. | ................ | 174/254 |

FOREIGN PATENT DOCUMENTS

| | | |
|---|---|---|
| TW | M317065 U | 8/2007 |
| TW | 201116175 A | 5/2011 |
| TW | 201137898 A | 11/2011 |
| TW | 201205605 A | 2/2012 |

OTHER PUBLICATIONS

Communication From the Taiwan Patent Office Regarding a Counterpart Foreign Application Dated (Taiwan Year 103) Apr. 21, 2014.

* cited by examiner

*Primary Examiner* — William H Mayo, III
(74) *Attorney, Agent, or Firm* — Rosenberg, Klein & Lee

(57) ABSTRACT

Disclosed is a flexible circuit cable with at least two bundled wire groups. The circuit cable has first and second ends respectively connected to first and second connection sections. The circuit cable includes a cluster section, which is formed of a plurality of cluster wires formed by slitting the circuit cable, in an extension direction of the cable, at a predetermined cut width. The cluster section includes at least two independent bundles, which are formed by dividing the cluster wires of the circuit cable into different signal groups according to electrical signals transmitted therethrough. Bundling members are used to the cluster wires of the independent bundles according to predetermined bundling modes. Further, the circuit cable has a surface forming a shielding conductive layer for electromagnetic interference protection and impedance control for internal signals of the circuit cable.

17 Claims, 7 Drawing Sheets

FLEXIBLE CIRCUIT CABLE WITH AT LEAST TWO BUNDLED WIRE GROUPS

BACKGROUND OF THE INVENTION

1. Field of the Invention

The present invention relates to the structure of signal transmission cable, and in particular to a flexible circuit cable with at least two bundled wire groups.

2. The Related Arts

In various modern electronic devices, since the amount of data transmitted through signal lines is getting larger and larger, the number of signal lines used must be more and more and the frequency with which signals are transmitted must be higher and higher. Consequently, a differential mode of high frequency transmission is commonly adopted to reduce electromagnetic interference (EMI). For example, such a transmission technique is widely applied to USB or LVDS signals to reduce EMI. However, after the assembling of the signal transmission lines is completed, these signal transmission lines are often bundled for, on the one hand, positioning and, on the other hand, protection. The conventionally adopted signal transmission line bundling techniques generally wrap and bundle all the signal transmission lines together and the material used for wrapping is a piece of insulation tape or a conductive fabric for mechanically protecting the wires and improving durability of folding and electrically shielding the high frequency transmission wires against EMI. Although interference caused by the external environment is reduced, yet due to the signals that are carried and transmitted by the signal transmission lines being of different frequencies, there is electromagnetic interference induced between the signal transmission lines. Combining all the signal transmission lines within the sane bundle would lead to the problem of electromagnetic interference between the signal transmission lines.

A conventional flat cable is generally structured by arraying a number of conductor wires that are covered with an outer insulation layer in a line to form a cable. Such a cable is widely applied to various electrical appliances, electronic equipments, computer facilities, and communication devices for transmission of signals. Such a conventional cable works just fine when used between fixedly connected components. However, in an application where a hinge structure is included, it does not suit the needs for such an application. Most of the currently available electronic equipments or communication devices include a hinge structure. For example, in the structure of a currently widely used telecommunication hand set, a cover or a screen is coupled to a main body of the hand set by a hinge structure. To allow electrical signals to transmit from the main body of hand set to the cover or screen, cable bundling techniques are currently available for handling the problem that a conventional cable is incapable of extending through a hinge structure. However, the cable bundling techniques are applied in such a way that all the wires of a cable are bundled together, which is then put collectively through a hinge structure. Such techniques require a sufficiently large space in the hinge structure to allow all the wires of the cable to simultaneously extend a narrow hole defined in the hinge. Thus, severe constraints are imposed on the designs of hinge structures.

Further, to meet the needs in space and use, product designs are of such a trend of being compact and light-weighted and occupying just an amount of space that is as small as possible. However, the conventional techniques of cable bundling impose a number of constraints to the layout of circuit board. Since the signal transmission lines of a bundled cable are connected to signal contacts of a circuit such that the signal contacts must be set on the circuit boards in a mutually spaced manner and not on the same area, yet all the signal transmission lines are bundled together, all the signal transmission lines must be extended for a longer length. This increases the wire cost. Further, all the signal transmission lines are bundled together in a single bundle and thus a relatively large bundle is formed. This requires an extremely large amount of space on the circuit board, making it is not possible for an electronic product to meet the needs of being compact and light-weighted. Further, the spatial arrangement of the circuit board is also subjected to undesired constraints and cannot be effectively used, leading to undesired difficult of design.

SUMMARY OF THE INVENTION

Thus, an object of the present invention is to provide a flexible circuit cable that comprises at least two bundled wire groups in order to overcome the drawbacks of the conventional cables in practical applications.

The solution that is adopted in the present invention to overcome the problems of the conventional techniques comprises slitting a circuit cable into a plurality of cluster wires in an extension direction of the circuit cable at a predetermined cut width so as to form a cluster section. The cluster section comprises at least two independent bundles, which define different signal groups according to electrical signals transmitted through the cluster wires of the circuit cable, such as a power wire group and a signal wire group. Further, a bundling member is used to wrap and bundle the plurality of cluster wires of each of the independent bundles according to a predetermined bundling mode.

The technical solution of the present invention separates a power wire group, a grounding wire group, and a signal wire group so as to effectively suppress electromagnetic interference induced by the power wire group affecting the signal transmission efficiency of the signal wire group. Further, the bundling members can be selectively made of one of insulation material, conductive fabric, and electromagnetic shielding material according to the signal groups. For example, the bundling member of the power wire group can be made of an electromagnetic shielding material to isolate electromagnetic interference. The bundling member of the signal wire group can be made of one of insulation material, conductive fabric, and electromagnetic shielding material. Further, the signal transmission efficiency is also affected by mutual interference induced among the cluster wires that transmit signals of different frequencies. Thus, further dividing the signal wire group in a high frequency signal group and a low frequency signal group can help reducing the problem of mutual interference induced between signals when the cluster wires are transmitting signals of different frequencies. Further, the cable, when received in a hinge, may easily induce static electricity due to rubbing and under such a condition, the static electricity can be conducted through an independent the grounding wire group to a proper site.

Another efficacy of the present invention is that a designer is provided with increased flexibility in making layout of circuit an arrangement of space. With the present invention, signal transmission wires are divided into independent bundles of different signal groups, so that the independent bundles of the signal groups required a reduced space in extending through a hinge structure. Further, a user may set the independent bundles of all groups simultaneously through a narrow hole according to the requirement of design, or alternatively, the independent bundles can be individually set through the narrow hole. This provides more flexibility in designing hinge structure.

In the layout of circuit design, the signal groups of the independent bundles the signal groups can be respectively connected to corresponding contact sites. Compared to the conventional bundling techniques, the length of extension can be reduced so as to lower down the wire cost and provide improved flexibility of spatial arrangement. The independent bundles of the signal groups individually occupy an amount of space on the circuit board that is much less that occupied by the cable bundling techniques and may be laid on a circuit board as required by a designer to thereby reduce the thickness of circuit board and make electronic products more compact and light-weighted in design.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
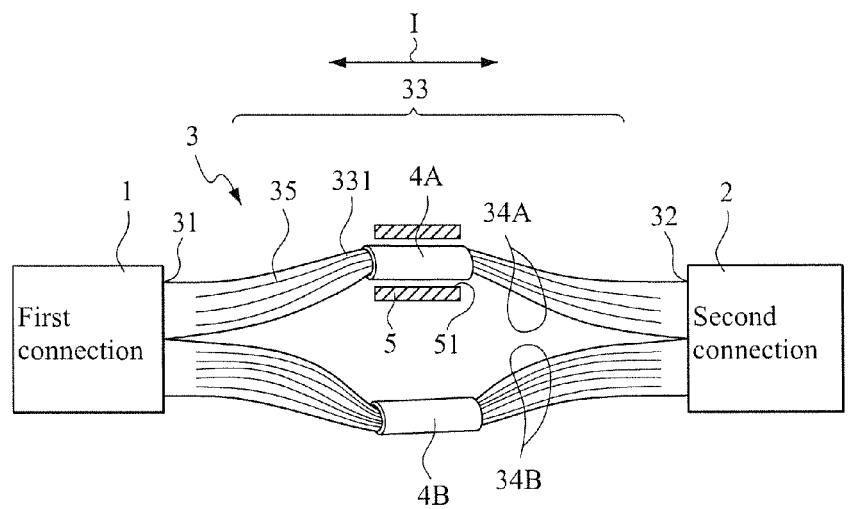
FIG. 1 is a schematic view showing a flexible circuit cable with at least two bundled wire groups constructed in accordance with the present invention.

With reference to the drawings and in particular to FIG. 1, which is a schematic view showing a flexible circuit cable with at least two bundled wire groups constructed in accordance with the present invention, a flexible circuit cable according to the present invention comprises a first connection section 1, a second connection section 2, a circuit cable 33, and at least two bundling members 4A, 4B.

Figure 2:
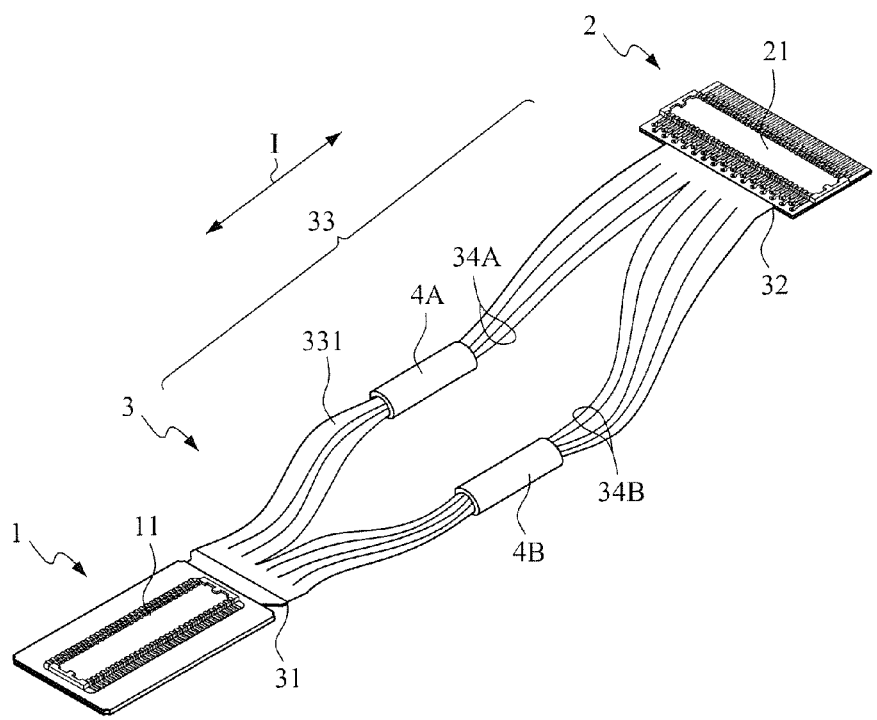
FIG. 2 is a schematic view showing that the first connection section and the second connection section of FIG. 1 respectively comprise a component mounting zone and a connector.
Figure 3:
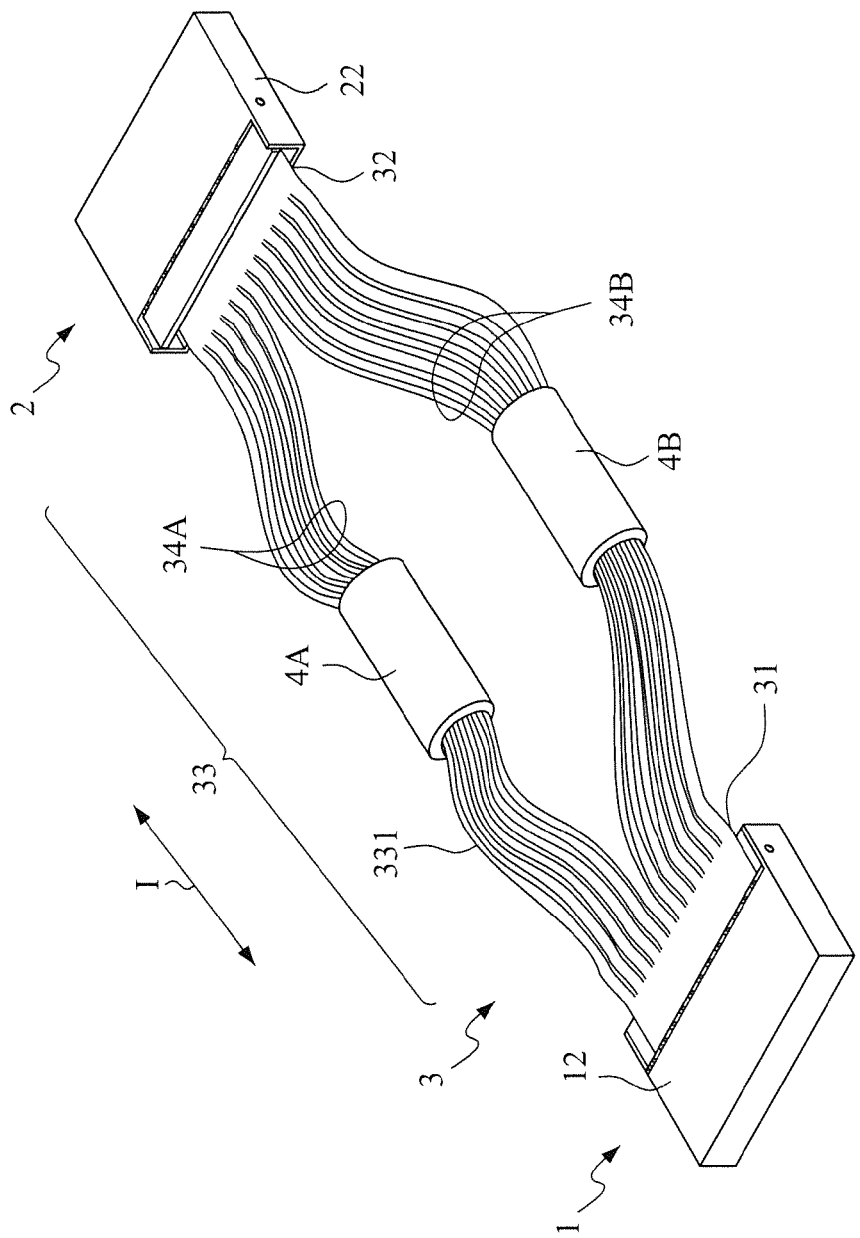
FIG. 3 is a schematic view showing that the first connection section and the second connection section of FIG. 1 comprise a connector.
Figure 4:
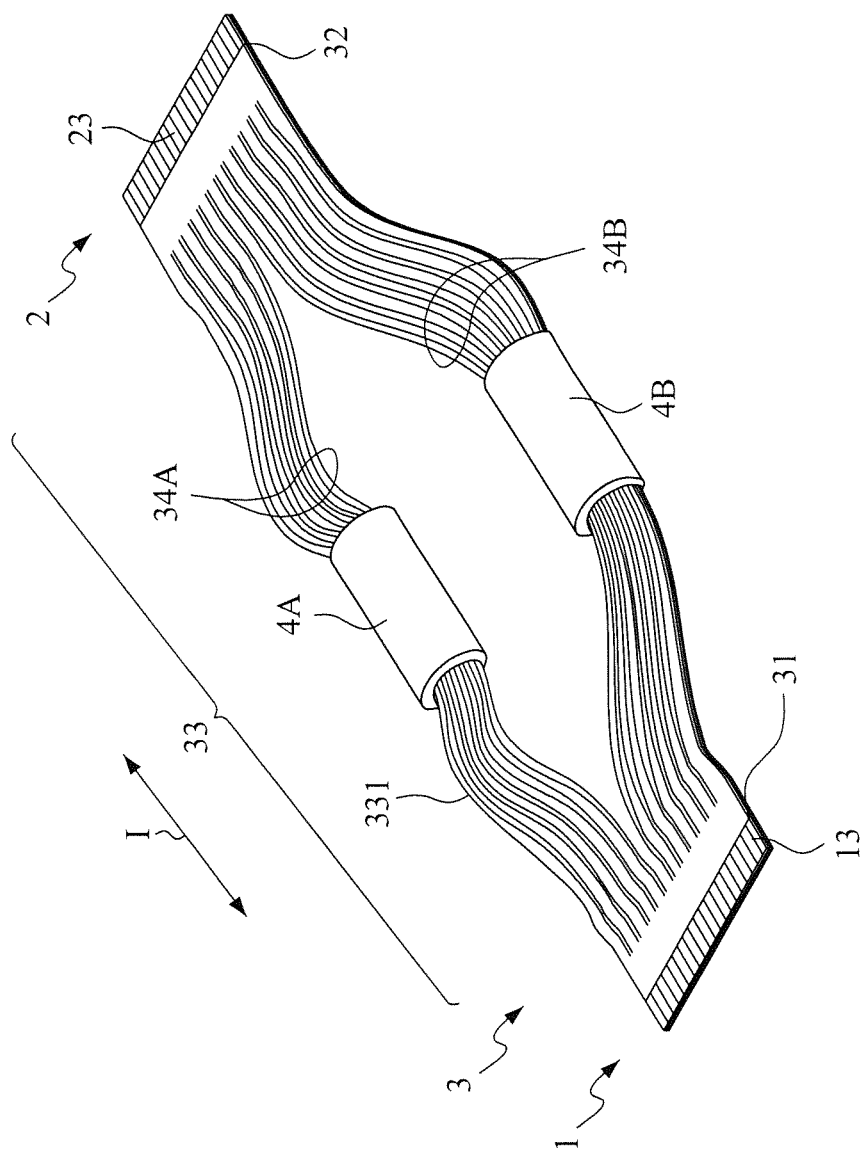
FIG. 4 is a schematic view showing that the first connection section and the second connection section of FIG. 1 comprise a plug terminal.

The first connection section 1 and the second connection section 2 can be made in the form of a plug terminal, a socket, a soldering terminal, an open terminal, or a composition mounting zone according to practical applications. As shown in FIG. 2, the first connection section 1 forms a component mounting zone, which has a surface forming a component mounting zone 11 where a connector can be mounted. The component mounting zone can be arranged in the direction shown in the drawing, or an arrangement by rotating 90 degrees is also feasible. The second connection section 2 may comprise a connector 21. In the illustration of FIG. 3, the first connection section 1 is made a connector 12 and the second connection section 2 is also a connector 22. In the illustration of FIG. 4, the first connection section 1 is made a plug terminal 13 and the second connection section 2 is also a plug terminal 23. The plug terminals comprise a known golden finger based plugging structure comprising a plurality of plugging pins or a sculpture plugging structure.

The circuit cable 3 comprises a first end 31 and a second end 32. The first end 31 is connected to the first connection section 1 and the second end 32 is connected to the second connection section 2. The circuit cable 3 can be a cable selected from commercialized a thin film printed electronic cable, a flexible flat cable (FFC), a flexible printed circuit (FPC), an electronic cable, a Teflon cable, a coaxial cable, a hybrid cable, or a composite cable combining at least two of the above cables. Further, the circuit cable 3 has at least a surface comprising a shielding conductive layer for protection against electromagnetic interference and impedance control for internal signals of the circuit cable.

The circuit cable 3 comprises a cluster section 33 between the first end 31 and the second end 32. The cluster section 33 is composed of a plurality of cluster wires 331 that are formed by slitting the circuit cable 3 at a predetermined cut width along parallel slitting lines 35 extending in extension direction I of the cable. Each of the cluster wires 331 is independently flexible.

Each of the cluster wires 331 contains therein a signal transmission conductor line that can be used to carry and transmit electrical signals. Based on the electrical signals carried, the cluster wires 331 of the circuit cable 3 are divided into different signal group. The signal groups may include at least a power wire group, a grounding wire group, a signal wire group, a high frequency signal group, and a low frequency signal group. The signal groups can be two or more groups selected from the above list.

In the arrangement of the present invention, the plurality of cluster wires 331 is separated into independent bundles 34A, 34B, which are then bundled by bundling members 4A, 4B according to a predetermined bundling mode and the signal groups. One of the independent bundles, such as bundle 34A, is put through a narrow hole 51 of a hinge structure 5 or an individual narrow hole. The bundling members are made of one of insulation material, conductive fabric, and electromagnetic shielding material.

Further, besides bundling the independent bundles 34A, 34B with the bundling members 4A, 4B as suggested above, it is also feasible to only bundle one of the independent bundles 34A, 34B with the corresponding bundling member 4A, 4B.

Figure 5:
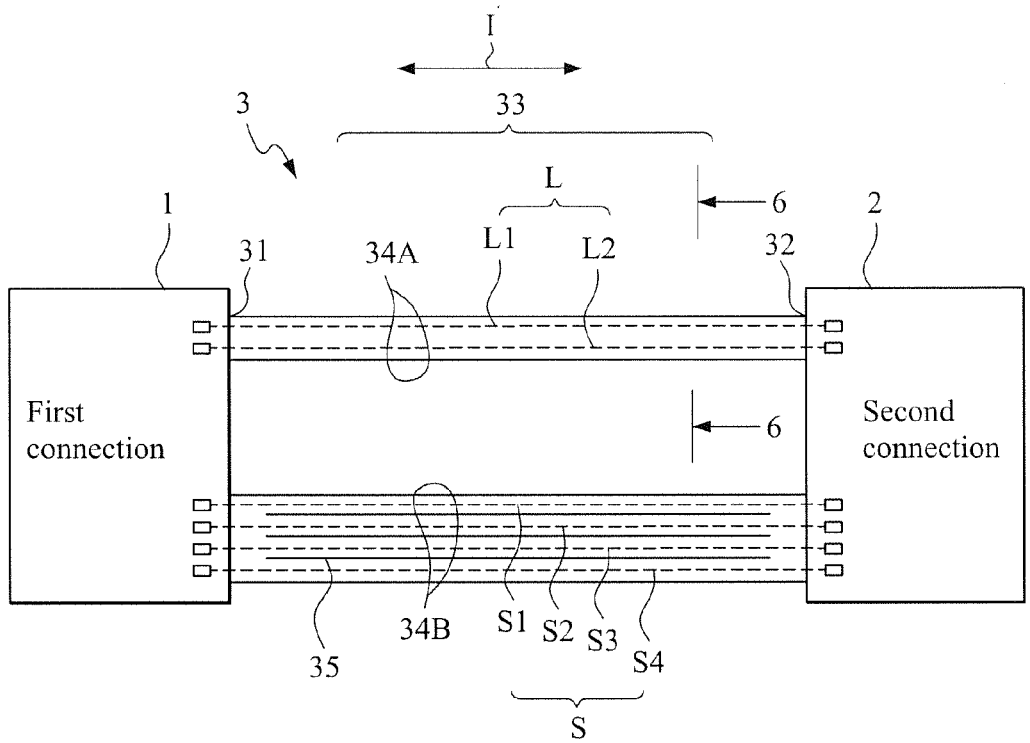
FIG. 5 schematically shows a first example embodiment of the flexible circuit cable with at least two bundled wire groups according to the present invention.

Referring to FIG. 5, a first example embodiment of the flexible circuit cable with at least two bundled wire groups according to the present invention is shown. As shown in the drawing, the signal groups are divided into a power wire group L and a signal wire group S, wherein the power wire group L comprises power wires L1, L2 and the signal wire group S comprises signal wires S1, S2, S3, S4. In the instant embodiment, the circuit cable is divided into two groups including a power wire group and a signal wire group. Since electromagnetic interference may be easily induced between the power wire group and the signal wire group to affect the efficiency of signal transmission, the two groups are separated from each other by being respectively included in two different independent bundles 34A, 34B for effectively suppressing electromagnetic interference. Further, in selecting the bundling members, a user may select different wrapping or bundling material to wrap or bundle respective signal groups. For example, an electromagnetic shielding material may be selected to wrap the independent bundle 34A of a power wire group, while the independent bundle 34B of a signal wire group may use a regular insulation material, conductive fabric, or electromagnetic shielding material so that the electromagnetic interference generated by the power wires can be isolated from affecting signal transmission efficiency.

Figure 6:
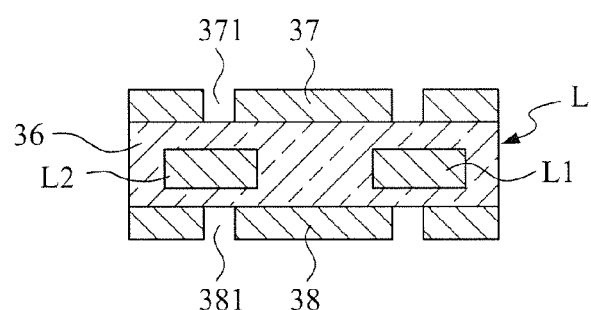
FIG. 6 is a cross-sectional view of a power wire group of FIG. 5.

Referring to FIG. 6, which is a cross-sectional view of the power wire group L shown in FIG. 5, as shown in the drawing, the power wire group L comprises power wires L1, L2 and an insulation layer 36 is set to cover the power wires L1, L2. The power wire group L has an upper surface forming a shielding conductive layer 37 and an opening structure 371 and a lower surface forming a shielding conductive layer 38 and an opening structure 381. The shielding conductive layers are provided for suppressing electromagnetic interference and controlling impedance for internal signals of the circuit cable.

Figure 7:
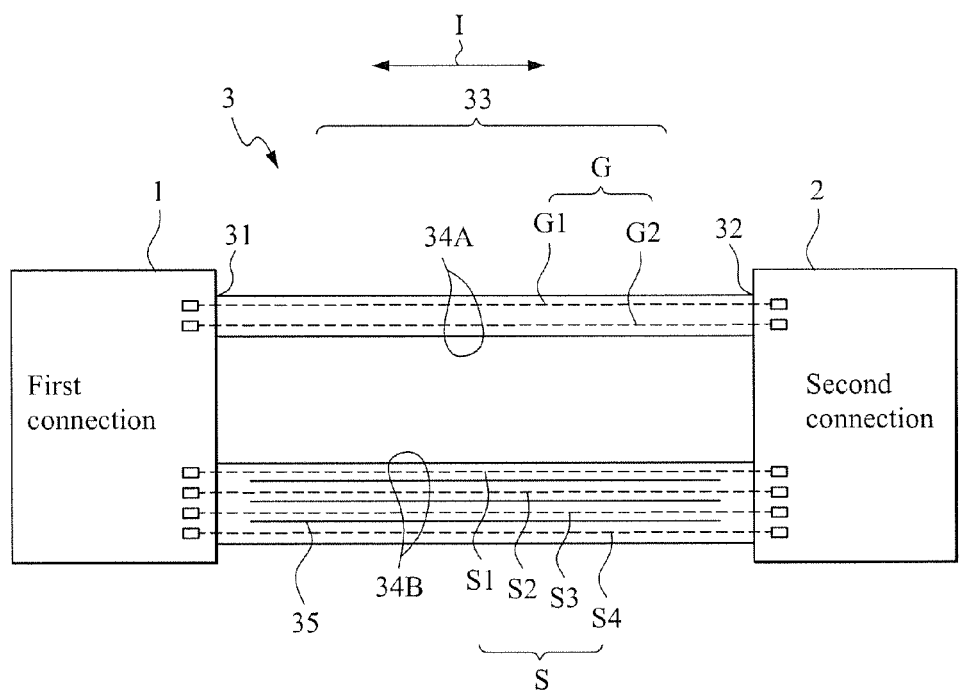
FIG. 7 schematically shows a second example embodiment of the flexible circuit cable with at least two bundled wire groups according to the present invention.

Referring to FIG. 7, a second example embodiment of the flexible circuit cable with at least two bundled wire groups according to the present invention is shown. As shown in the drawing, the signal groups are divided into a grounding wire group G and a signal wire group S. The grounding wire group G comprises power wires G1, G2 and the signal wire group S comprises signal wires S1, S2, S3, S4. In the instant embodiment, the circuit cable is divided into two groups including a grounding wire group and a signal wire group. Since static electricity may be easily generated by rubbing in extending a cable through a hinge, the independent grounding wire group is helpful in this situation to conduct the static electricity to a proper site.

Figure 8:
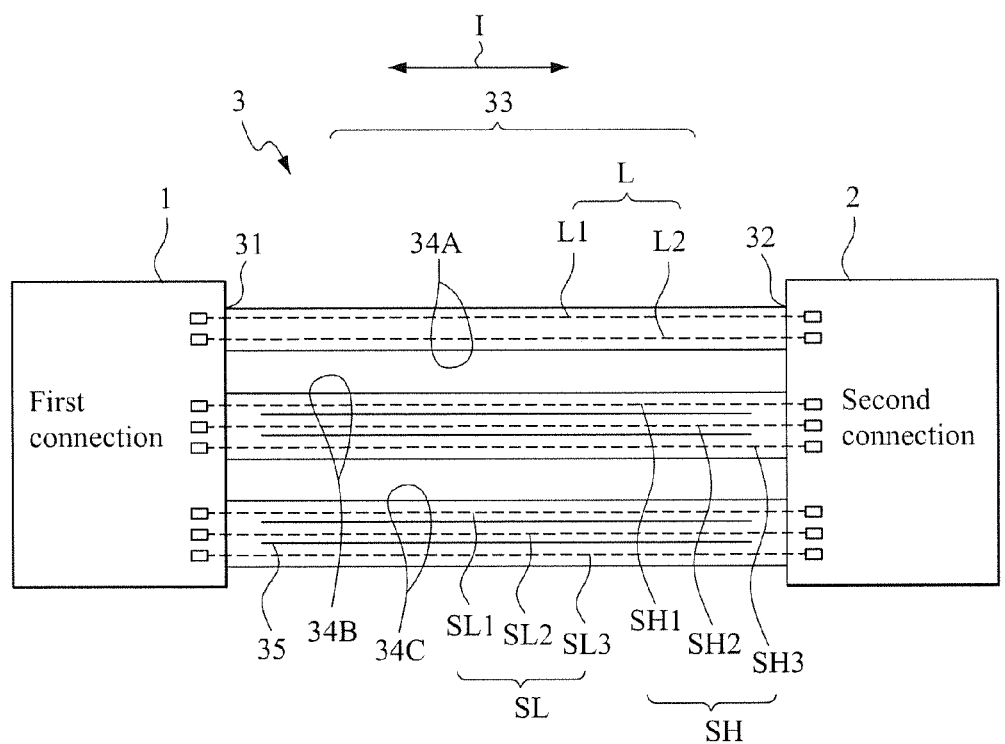
FIG. 8 schematically shows a third example embodiment of the flexible circuit cable with at least two bundled wire groups according to the present invention.

Referring to FIG. 8, a third example embodiment of the flexible circuit cable with at least two bundled wire groups according to the present invention is shown. As shown in the drawing, the signal groups are divided into a power wire group L, a high frequency signal group SH, and a low frequency signal group SL. The power wire group L comprises power wires L1, L2. The high frequency signal group SH comprises high frequency signal wires SH1, SH2, SH3. The low frequency signal group comprises low frequency signal wires SL1, SL2, SL3. In the instant embodiment, the signal groups are further divided into a high frequency signal group and a low frequency signal group. Besides electromagnetic interference being easily induced between the power wire group and the signal wire groups to affect signal transmission efficiency, the cluster wires 331 may interfere with each other in transmitting signals of different frequencies so as to affect signal transmission efficiency. By dividing the signal wire groups into an independent bundles 34B of high frequency signal group and an independent bundles 34C of low frequency signal group, besides the electromagnetic interference caused on the signal wire groups by the power wire group being reduced, the signal transmission efficiency being affected by mutual interference between the high frequency signal group and the low frequency signal group due to transmission of electrical signals in different frequencies can also be omitted. Further, a user may select different materials for the bundling members according to the different electrical signals transmitted by the signal groups so as to eliminate the problem of electromagnetic interference. For example, an electromagnetic shielding material can be selected for the independent bundle 34A to wrap the power wire group and a regular insulation material, conductive fabric, or electromagnetic shielding material can be selected for the independent bundle 34B to wrap the high frequency signal group. And, a regular insulation material, conductive fabric, or electromagnetic shielding material can be selected for the independent bundle 34C to wrap the low frequency signal group.

As shown in FIG. 8, the independent bundles 34A, 34B, 34C of the signal groups can be cut to an identical width or different widths according to the requirements of users. A single cluster wire may be selected as a unit for cutting the desired cut width so that all the cluster wires are cut as individual wires. Alternatively, two or more cluster wires may be used as a cutting unit in order to improve flexibility of circuit layout design by the user.

Figure 9:
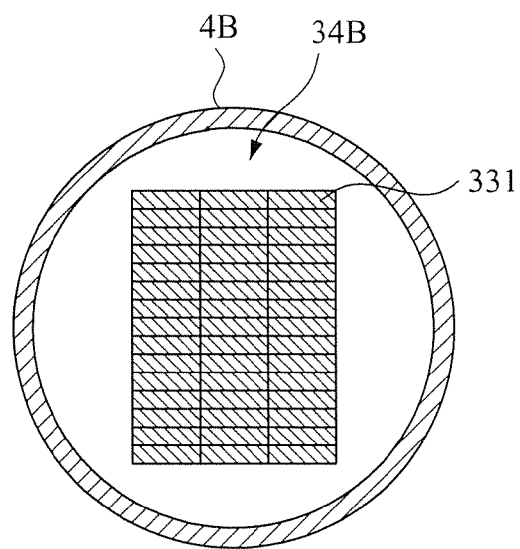
FIG. 9 schematically shows that bundling mode of the independent bundle 34B is regular stacking.
Figure 10:
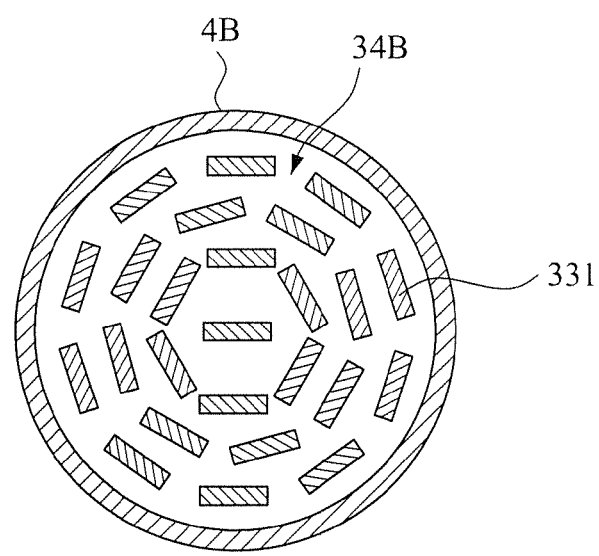
FIG. 10 schematically shows that bundling mode of the independent bundle 34B is random packing.

As shown in FIGS. 9 and 10, the bundling member 4 wraps around and bundle a plurality of cluster wires 331 and the bundling mode can be selected as desired by the user and according to the circuit arrangement to be regularly stacked (see FIG. 9) randomly packed (see FIG. 10).

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A flexible circuit cable with at least two bundled wire groups, comprising:
   a first connection section;
   a second connection section; and
   a circuit cable, which comprises a first end and a second end, wherein the first end is connected to the first connection section and the second end is connected to the second connection section, the circuit cable comprising a cluster section between the first end and the second end, the cluster section comprising a plurality of cluster wires that is formed by slitting the circuit cable at a predetermined cut width in an extension direction of the circuit cable, each of the cluster wires being independently flexible, each of the cluster wires carrying and transmitting a plurality of electrical signals;
   wherein the cluster section of the circuit cable comprises at least one first independent bundle and at least one second independent bundle, the independent bundles being formed of different signal groups by dividing the cluster wires of the circuit cable according to the electrical signals carried and transmitted thereby.

2. The flexible circuit cable as claimed in claim 1, wherein at least one bundling member is used to bundle the plurality of cluster wire to form the independent bundles according to a predetermined bundling mode and the signal groups.

3. The flexible circuit cable as claimed in claim 1, wherein the signal groups comprise a power wire group, a grounding wire group, a signal wire group, a high frequency signal group, and a low frequency signal group.

4. The flexible circuit cable as claimed in claim 1, wherein the bundling mode comprises applying a regular stacking or a random packing manner to bundle the cluster wires of the independent bundle.

5. The flexible circuit cable as claimed in claim 1, wherein the first independent bundle and the second independent bundle are of the same cut width.

6. The flexible circuit cable as claimed in claim 1, wherein the first independent bundle and the second independent bundle are of different cut widths.

7. The flexible circuit cable as claimed in claim 1, wherein the circuit cable comprises one of a thin film printed electronic cable, a flexible flat cable (FFC), a flexible printed circuit (FPC), an electronic cable, a Teflon cable, a coaxial cable, a hybrid cable, and a composite cable combining at least two of the above cables.

8. The flexible circuit cable as claimed in claim 1, wherein the bundling member comprises one of an insulation material, a conductive fabric, and an electromagnetic shielding material.

9. The flexible circuit cable as claimed in claim 1, wherein the first connection section comprises one of a plug terminal, a socket, a soldering terminal, an open terminal, and a composition mounting zone.

10. The flexible circuit cable as claimed in claim 1, wherein the second connection section comprises one of a plug terminal, a socket, a soldering terminal, an open terminal, and a composition mounting zone.

11. The flexible circuit cable as claimed in claim 1, wherein the circuit cable has at least one surface forming a shielding conductive layer.

12. The flexible circuit cable as claimed in claim 11, wherein the shielding conductive layer forms at least one opening structure.

13. The flexible circuit cable as claimed in claim 1, wherein one of the first independent bundle and the second independent bundle comprises a power wire group.

14. The flexible circuit cable as claimed in claim 1, wherein one of the first independent bundle and the second independent bundle comprises a grounding wire group.

15. The flexible circuit cable as claimed in claim 1, wherein one of the first independent bundle and the second independent bundle comprises a high frequency differential signal group.

16. The flexible circuit cable as claimed in claim 1, wherein at least two independent bundles of the at least one first independent bundle and the at least one second independent bundle are simultaneously received through a narrow hole.

17. The flexible circuit cable as claimed in claim 1, wherein at least one independent bundle of the at least one first independent bundle and the at least one second independent bundle is received through an independent narrow hole alone.

* * * * *